United States Patent [19]

Inada et al.

[11] Patent Number: 5,656,526
[45] Date of Patent: Aug. 12, 1997

[54] METHOD OF FABRICATING A DISPLAY DEVICE

[75] Inventors: Katsuhiko Inada, Himeji; Osamu Shimada, Hyogo-ken; Masahiro Seiki, Himeji; Ryuji Tada, Hyogo-ken; Atsushi Sugahara, Yokohama, all of Japan

[73] Assignee: Kabushiki Kaisha Toshiba, Kanagawa-ken, Japan

[21] Appl. No.: 495,630

[22] PCT Filed: Dec. 7, 1994

[86] PCT No.: PCT/JP94/02053

§ 371 Date: Nov. 7, 1995

§ 102(e) Date: Nov. 7, 1995

[87] PCT Pub. No.: WO95/16276

PCT Pub. Date: Jun. 15, 1995

[30] Foreign Application Priority Data

Dec. 7, 1993 [JP] Japan .................................. 5-306186

[51] Int. Cl.$^6$ ......................................... H01L 21/786
[52] U.S. Cl. ..................... 430/314; 430/317; 438/946; 438/30; 349/187
[58] Field of Search ........................ 437/51, 47, 181, 437/40 TFI, 40 TFT, 41 TFI, 41 TFT, 229; 148/DIG. 150; 430/314, 317

[56] References Cited

U.S. PATENT DOCUMENTS

| | | | |
|---|---|---|---|
| 4,792,210 | 12/1988 | Maurice | 437/181 |
| 4,878,086 | 10/1989 | Isohata et al. | 359/59 |
| 4,902,638 | 2/1990 | Muto | 437/51 |
| 5,069,534 | 12/1991 | Hirai | 359/54 |
| 5,087,113 | 2/1992 | Sakono et al. | 359/59 |
| 5,162,931 | 11/1992 | Holmberg | 359/54 |
| 5,466,620 | 11/1995 | Bang | 437/51 |

FOREIGN PATENT DOCUMENTS

| | | |
|---|---|---|
| 58-4927 | 1/1983 | Japan . |
| 61-240281 | 10/1986 | Japan . |
| 61-242021 | 10/1986 | Japan . |
| 62-183519 | 8/1987 | Japan . |

*Primary Examiner*—Michael Trinh
*Attorney, Agent, or Firm*—Finnegan, Henderson, Farabow, Garrett & Dunner, L.L.P.

[57] ABSTRACT

An object of the technology of our invention is to solve a luminance defect viewed as a "seam" or the like and to provide a liquid crystal display device having a screen for equally displaying an image. For example, when an exposing process is performed for one conductor layer or a dielectric layer, a total of four photomasks are used corresponding to four shot areas. A light insulation layer of a photomask used for the exposing process for patterning for example a signal line is formed so that it becomes a projection pattern of the signal line. The photomasks corresponding to adjacent shot areas are formed so that patterns of the light insulation layers of the boundary portion are engaged with each other on the plane.

5 Claims, 8 Drawing Sheets

METHOD OF FABRICATING A DISPLAY DEVICE

TECHNICAL FIELD OF THE INVENTION

The present invention relates to a liquid crystal display device and a fabrication method thereof, in particular, to a liquid crystal display device having a screen for equally displaying an image free of a line shaped luminance defect and a fabrication method thereof.

BACKGROUND OF THE INVENTION

A related art reference of the present invention will be described with reference to an active matrix type liquid crystal display device having a display pixel electrode array that is constructed of thin film transistors (thereinafter referred to as TFTs) as switching devices.

The active matrix type liquid crystal display device comprises an array substrate, an opposite substrate, and a liquid crystal material. A display pixel electrode array is formed on the array substrate. An opposite electrode is formed on the opposite substrate. The liquid crystal material is disposed between the array substrate and the opposite substrate. The TFTs and display pixel electrodes connected thereto are formed on the array substrate in a matrix shape. In addition, scanning lines are connected in common to gates of the TFTs in the column direction of the matrix. Signals lines are connected in common to drain electrodes of the TFTs in the row direction of the matrix. Moreover, capacitive lines and so forth are disposed opposite to the display pixel electrodes through an insulation layer.

These electrodes and semiconductor devices such as TFTs are conventionally fabricated by thin film pattern forming technologies, namely photofabrication technologies.

In a conventional thin film pattern forming process, a thin film material is formed on a substrate by a particular film forming method such as spattering method or CVD method. The thin film is patterned in a desired shape by so-called photoetching process (PEP).

In other words, a photoresist is coated on the thin film formed on the substrate. The photoresist is developed in a predetermined pattern by an exposing process. In other words, a photomask having a light insulating member with a predetermined pattern is aligned on the upper surface of the substrate. Rays of light are exposed to the substrate through the photomask.

Thereafter, the exposed photoresist is developed. With a mask of the developed photoresist, the undesired portion of the thin film formed on the substrate is etched out and a desired pattern is obtained. By repeating these processes the number of times corresponding to the number of layers of thin films that construct the electrodes and semiconductor devices, a desired device can be fabricated.

As the areas of optical devices such as liquid crystal display devices increase, needs of thin film forming technologies and patterning technologies for fabricating their display devices are becoming strong.

For example, when the exposing process is performed, since an optical portion of the exposing device has a restricted performance, the area of the substrate that is exposed by the exposing device at a time is restricted. To expose a large area of a substrate, so-called division exposing (stepper) method is employed.

In the division exposing method using the stepper, the area of the substrate to be exposed is divided into a plurality of exposure areas as shown in FIG. 11. The exposing device performs the exposing process (shot) for one of the divided exposure areas at a time. Thus, the exposing process is repeated the number of times corresponding to the number of the divided areas (namely, the process is performed in so-called step and repeat method). As a result, the exposure process is performed on the entire surface of the substrate. Consequently, the exposing device can expose a large area of a substrate that is greater than the area of the exposing device.

However, in an active matrix type liquid crystal display apparatus fabricated by the stepper method, when the same image signal is input to pixels in different exposure areas, the luminances thereof may be different from each other. In particular, when the difference of luminances in adjacent exposure areas is large, the boundary line of each exposure area is viewed as a "seam". Thus, the display quality of the active matrix type liquid crystal display apparatus that should display an image with high accuracy is remarkably deteriorated.

It is known that the difference of luminances in adjacent exposure areas results from the following reasons.

In other words, in a capacitive drive type display device such as a liquid crystal display device, a divided voltage of the input signal takes place between the capacitance of the pixel and a stray capacitance of the pixel. Thus, the voltage applied to the pixel is shifted by the divided voltage of the stray capacitance.

The amount of the stray capacitance depends on the overlap amount of each thin film pattern that constructs each pixel of the display device. When a photomask used for the exposing process of each thin film layer is aligned with an error against a predetermined position, a developed photoresist pattern and an etched thin film pattern deviate from their predetermined positions. Thus, the upper thin film pattern deviates from the lower thin film pattern. Consequently, the overlap amount of the fabricated device deviates from the designed overlap amount.

In addition, due to the accuracy of the drive portion of the exposing device, the deviation of a photomask in one exposure area (namely, mask alignment) may be different from that in another exposure area. Consequently, since the overlap amount and the stray capacitance in one exposure area are different from those in another exposure area, the voltage shift amount varies in each exposure area.

Thus, in the liquid crystal display device fabricated by the conventional fabrication method, there is a difference of luminances in different exposure areas, resulting in an irregular display image.

Experimental results of the display screen of the liquid crystal display device fabricated by the conventional fabrication method shows the following points. In particular, when the same image signal is input to pixels in two adjacent exposure areas, if the difference of transmittances of pixels in one area and pixels in another area is 0.5% or greater, the difference is viewed as a "seam" of the areas.

The present invention is made from the above-described point of view. An object of the present invention is to provide a liquid crystal display device having an equal display screen free of an obtrusive line-shaped luminance defect such as a "seam".

SUMMARY OF THE INVENTION

In the case that a photoresist is exposed with a plurality of areas for a display device such as a liquid crystal display device and then pixels are patterned in an array shape, if there is a difference of luminances in the divided display areas (small areas), the graduation of change of luminances in the vicinity of the boundary line of adjacent areas is decreased so as to allow the "seam" of the areas to be unobtrusive. This is the fundamental technical art of the present invention.

In other words, according to the display device and the fabrication method of the present invention, the boundary line of small areas is formed so that pixels of adjacent display areas are mixed in a boundary area thereof so as to equalize the apparent difference of luminances of pixels in the vicinity of the boundary line of the small areas.

Thus, according to the related art reference, since display areas are divided by a straight line along a boundary line, the difference of luminances of left and right display areas or upper and lower display areas is large. Consequently, the difference of luminances on the boundary line is remarkably viewed. However, according to the present invention, since the curve of change of luminances from one display area to another display area is gradual, the difference of luminances on the boundary line of the display areas is almost unobtrusive.

In addition, according to the fabrication method of the display device of the present invention, a thin film that constructs a display device is divided into small areas and a photoresist is exposed or a thin film is patterned so that the boundary line of adjacent small areas is formed in a nonlinear shape. Thus, pixels in one patterning area and pixels in another patterning area are mixed in the vicinity of the boundary line of the adjacent areas. Consequently, even if the luminance characteristics of pixels in both areas deviate due to the misalignment of masks in the patterning process, the apparent luminances in the vicinity of the boundary line can be equalized.

Thus, the change of luminances in adjacent exposure areas due to the shot deviation in for example the division exposing process can be decreased and the boundary line of the areas can become unobtrusive.

Examples of the conductor layer or dielectric layer according to the present invention are metal layers of Cr, Al, and the like, semiconductor layers such as amorphous silicon film, doped layers in which impurities are doped in the semiconductor layers, and insulation film layers such as SiOx film and SiNx film.

The area in the vicinity of the boundary line is an area including pixels disposed on the boundary line of at least adjacent areas. The width of the area on the boundary line varies depending on parameters such as luminance characteristics of each display device. However, the width of the area on the boundary line should be designated so that the apparent difference of luminances on the boundary line is unobtrusive.

DETAILED DESCRIPTION OF THE INVENTION

Figure 1:
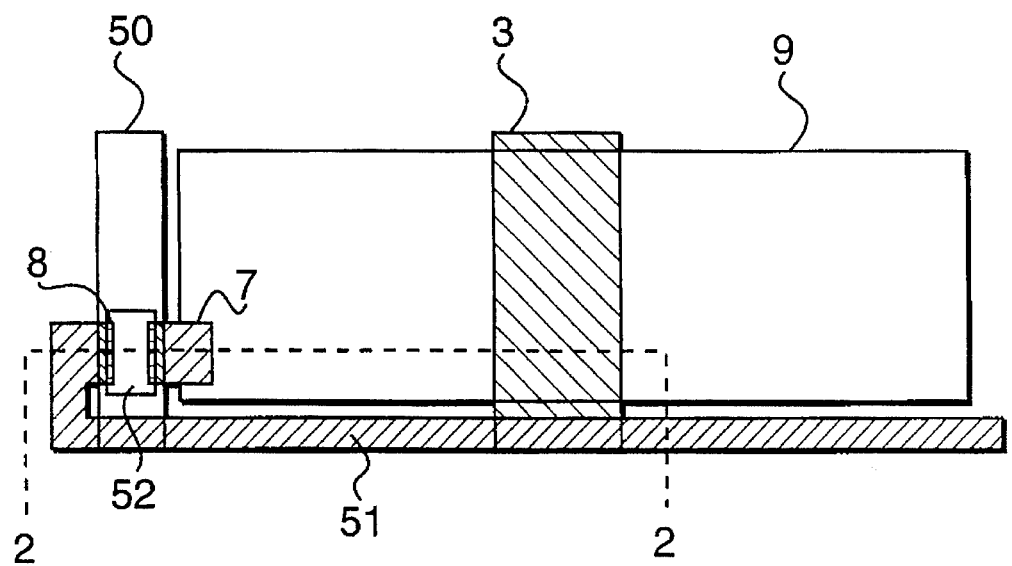
FIG. 1 is a plan view showing an outlined structure of a pixel of a liquid crystal display apparatus fabricated according to an embodiment of the present invention.
Figure 2:
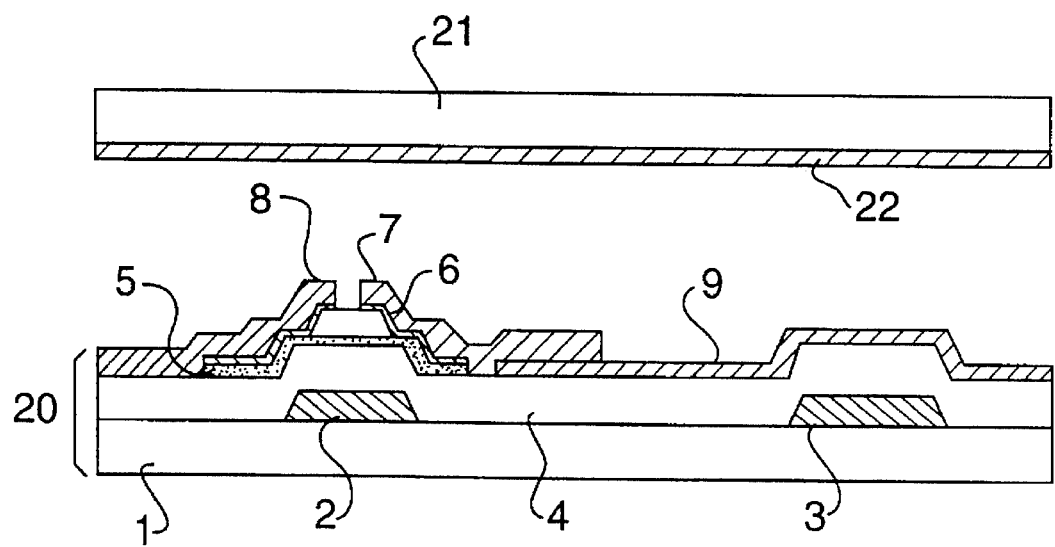
FIG. 2 is a sectional view showing the structure taken along line 2—2 of FIG. 1.

With reference to the accompanying drawings, an embodiment of the present invention will be described below. In this embodiment, the present invention is applied for an active matrix type liquid crystal display apparatus. FIG. 1 is a plan view showing an outlined structure of a pixel of an array substrate fabricated corresponding to a fabrication method according to the present invention. FIG. 2 is a sectional view taken along line 2—2 of FIG. 1.

A plurality of TFTs 52 and a plurality of display pixel electrodes 9 connected thereto are disposed in a matrix shape on an array substrate. The TFTs 52 are connected to scanning lines 50 in a row direction of the array substrate. In addition, the TFTs 52 are connected to signal lines 51 in a column direction of the array substrate.

Each TFT 52 comprises a gate electrode 2 integrally formed with a scanning line 50, a gate insulation film 4 formed on the gate electrode 2, a source electrode 7, and a drain electrode 8 disposed opposite to the source electrode 7 through a semiconductor layer 5.

The source electrode 7 is connected to the display pixel electrode 9. The drain electrode 8 is integrally formed with the signal line 51. Ohmic contact layers 6 are disposed between the source electrode 7 and the semiconductor layer 8 and between the drain electrode 8 and the semiconductor layer 8.

When necessary, a capacitive electrode 3 is formed below the display pixel electrode 9 through the gate insulation film 4 in such a manner that the capacitive electrode 3 is disposed opposite to the display pixel electrode 9. A capacitor is formed by the capacitive electrode 3, the display pixel electrode 9 opposite thereto, and the gate insulation film 4 surrounded by the capacitive electrode 3 and the display pixel electrode 9.

Next, the fabrication process of the array substrate according to the present invention will be described.

A Ta film is deposited on an electrically insulating substrate 1 with light transmitting characteristics by spattering method. An example of the substrate 1 is a glass substrate. Thereafter, the front surface of the resultant structure is patterned in a desired shape by PEP method so as to form connection terminals (not shown) connected to the scanning lines 50 in the row direction of the substrate 1 and an external circuit.

Thereafter, an SiOx film, an a-Si film, and a n+ a-Si film are successively deposited on the resultant structure by CVD method. Next, the a-Si film and the n+ a-Si film are patterned in a desired shape by PEP method. As a result, the semiconductor layer 5 and the ohmic contact layer 6 are formed.

Thereafter, an indium tin oxide (ITO) film is deposited on the resultant structure by spattering method and then patterned in the shape of the display pixel electrode 9 by PEP method.

Next, an Al film is deposited on the resultant structure by spattering method and then the source electrode 7, the drain electrode 8, and the signal line 51. The signal line 51 is integrally formed with the drain electrode 8.

The PEP process for forming each electrode layer and the semiconductor layer comprises a process for forming a thin film of a material to be patterned, a process for coating a photoresist on the entire surface of the thin film, a process for exposing the photoresist with a photomask on which a predetermined pattern is drawn, a process for developing the exposed photoresist and obtaining a predetermined pattern (resist image), and process for etching out the undesired portion of the thin film with a mask of the photoresist by a photoetching patterning method such as wet etching method or chemical dry etching method.

Figure 3:
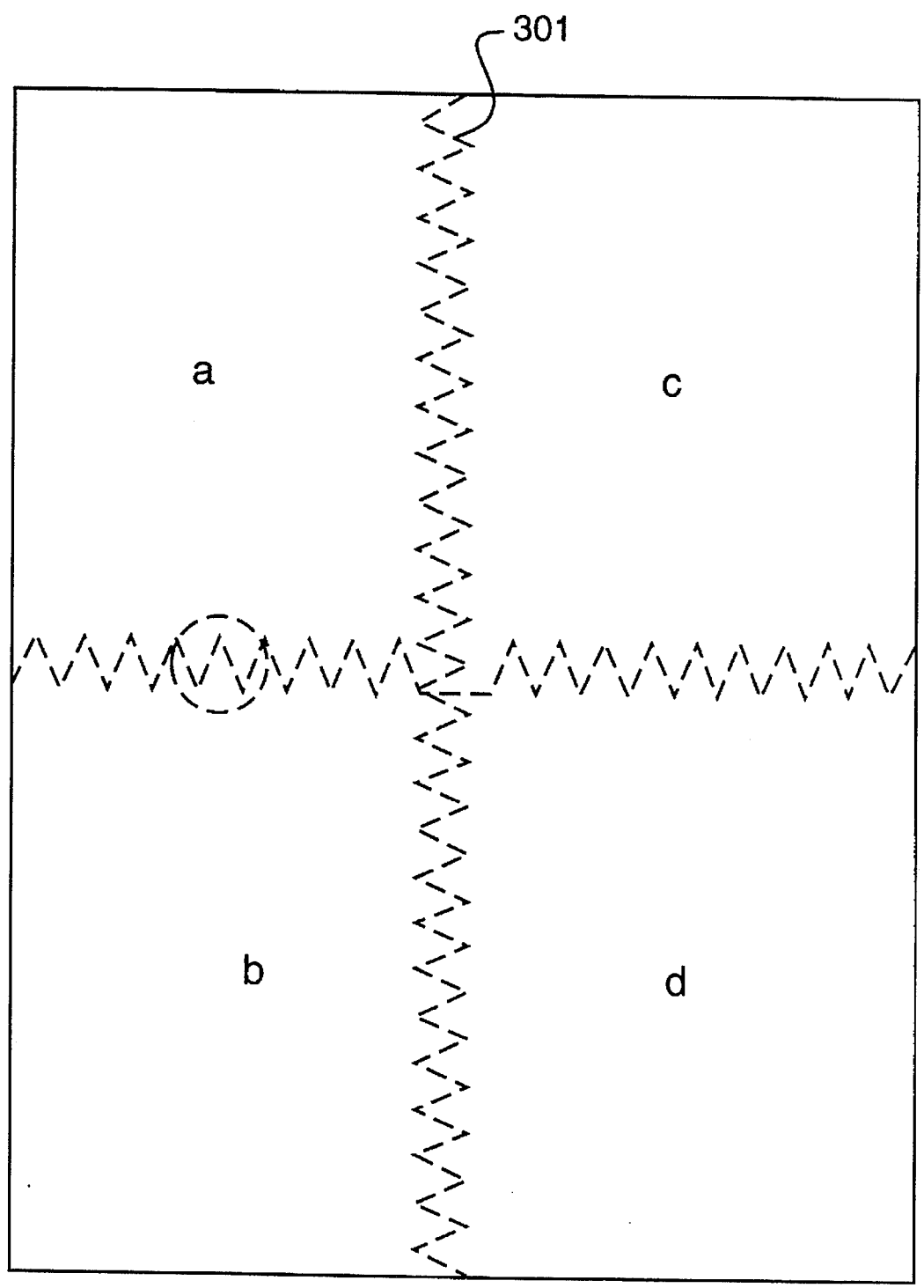
FIG. 3 is a plan view conceptually showing a process for dividing an area of a thin film formed on an array substrate of the liquid crystal display apparatus according to the present invention into a plurality of shot areas and performing an exposing process for each of the divided areas.

In the exposing process, the thin film forming area on the array substrate is divided into a plurality of shot areas. The exposing process is performed for each of the divided shot areas. FIG. 3 is a sectional view conceptually showing the divided shot areas. As shown in FIG. 3, the area on the substrate is divided into four shot areas a, b, c, and d. The exposing process is performed for each of the shot areas a, b, c, and d. This method is referred to as division exposing method.

Figure 4:
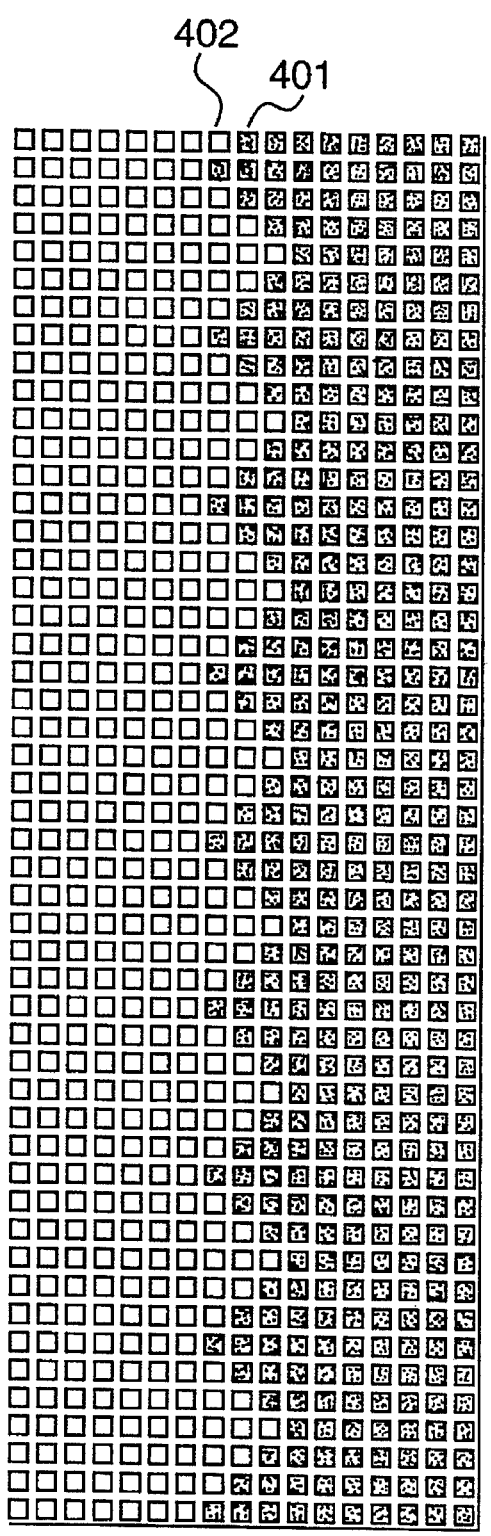
FIG. 4 is an enlarged view partially showing the vicinity of a boundary line of the adjacent shot areas (small areas) of FIG. 3.

FIG. 4 is an schematic diagram for explaining the division exposing method in detail. FIG. 4 is an enlarged view showing the vicinity of a boundary line 301 of adjacent shot areas represented by a dotted line in FIG. 3. In FIG. 4, each dot represents an area on which one pixel is formed. Black dots 401 represent pixels in one shot area. On the other hand, white dots 402 represent pixels in another shot area. In other words, the pixels represented by the black dots 401 belong to the right side small area of FIG. 4. On the other hand, the pixels represented by the white dos 402 belong to the left side small area of FIG. 4.

As shown in FIG. 4, the boundary line 301 of the areas is formed corresponding to the arrangement in the vertical direction of the pixels so that pixels of the different shot areas are regularly mixed at pitches of three pixels in the row direction and six pixels in the column direction. In other words, the boundary line 301 that is a contour line of each small area is formed in a non-linear shape.

Figure 5:
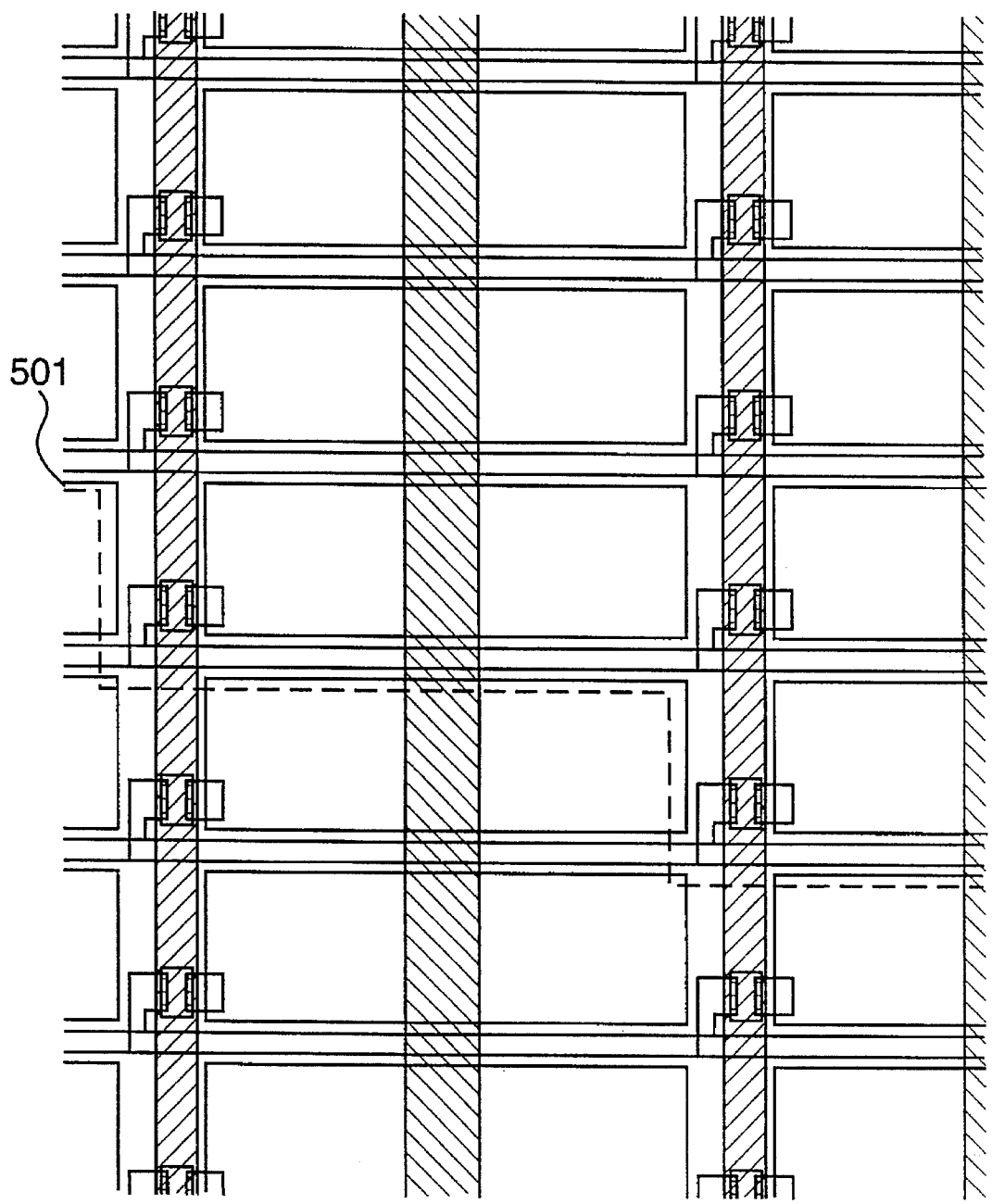
FIG. 5 is an enlarged view partially showing a pixel array of the liquid crystal display device fabricated by applying the small area dividing method according to the present invention to a real pixel pattern.

FIG. 5 is an enlarged plan view showing a part of a pixel array of the liquid crystal display device fabricated by applying the small area dividing method for a real pixel pattern. In FIG. 5, a dotted line 501 represents a boundary line of adjacent shot areas (namely, the boundary line 301 of FIG. 3). A contour line of a photomask is patterned so as to perform the exposing process corresponding to the pattern represented by the dotted line.

Figure 6:
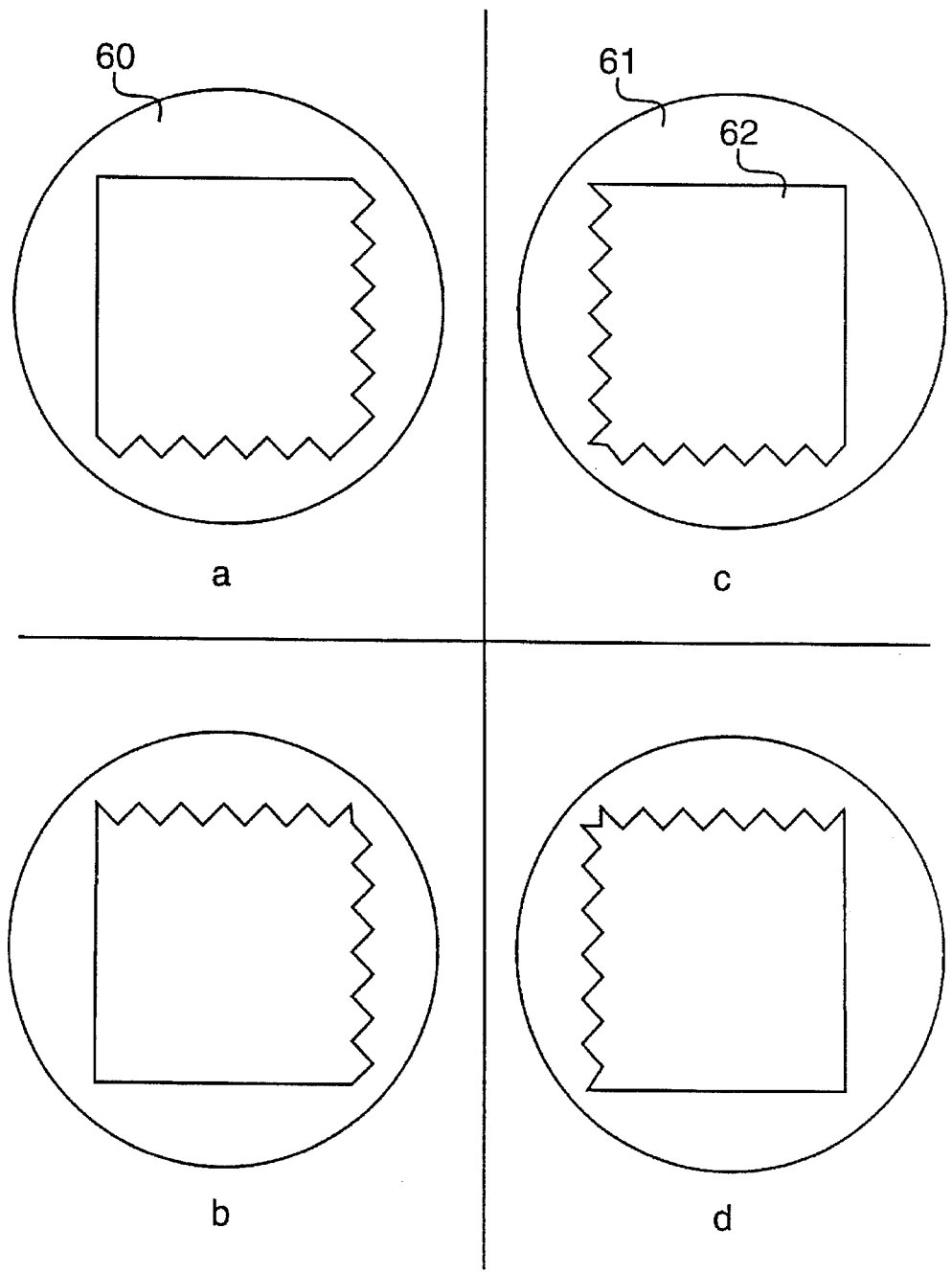
FIG. 6 is a plan view showing outer shapes of mask patterns of photomasks used in a fabrication method according to an embodiment of the present invention.

FIG. 6 is a plan view showing photomasks. As shown in FIG. 6, in this embodiment, a total of four photomasks 60 are used for exposing one conductor layer or one dielectric layer corresponding to four shot areas a, b, c, and d. Each of the photomasks 60 is fabricated by forming a light insulation layer 62 composed of Cr or the like on a transparent substrate 61 composed of glass, artificial quartz, or the like in a predetermined pattern. For example, the light insulation layer 62 for the photomasks used for patterning the signal lines 51 is formed as a projection pattern of the signal lines 51. The photomasks (for example, the masks a and b) corresponding to the adjacent shot areas are formed in such a manner that the patterns of the light insulation layers 62 in the boundary portion are alternatively engaged with each other on the plane.

The four shot areas are exposed corresponding to the four photomasks a, b, c, and d by the division exposing method. Thereafter, a thin film is patterned by the etching process.

The exposing process and the etching process are performed for each thin film that constructs the array substrate. As a result, the array substrate as shown in FIGS. 1 and 5 is obtained.

In this embodiment, a so-called overlapped exposing process is performed in the vicinity of the boundary of the shot areas.

In the overlapped exposing process, each shot area is exposed in such a manner that it is partially overlapped with a part of another adjacent shot area that has been exposed. The overlapped exposing process is performed so as to prevent a portion in the vicinity of a boundary line of shot areas from being unexposed.

Actually, the positions of the photomasks are aligned so that the edge portions of areas that have been exposed are exposed. For example, each photomask is aligned so that the boundary line represented by the dotted line shown in FIG. 3 becomes a dual line with a predetermined width.

Figure 7:
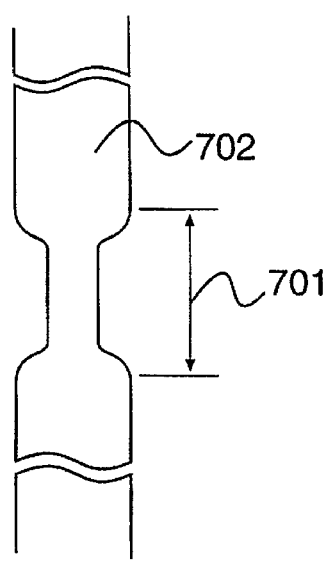
FIG. 7 is a schematic diagram showing a pattern with a center narrow portion formed in a double exposure area.

In addition, the exposure amount of the photoresist in the area on which the overlapped exposing process is performed is greater than the exposure amount of the other areas. Thus, when the area on which the overlapped exposing process is performed is developed, the pattern width of the photoresist may be narrow. Consequently, the thin film patterned with such a mask may be formed in a shape with a center narrow portion such as a wiring pattern 702 of a overlapped exposure area 701 as shown in FIG. 7.

Since the pattern shape (pattern width) of pixels formed in the overlapped exposure area may be different from that in other areas, it is not preferable to excessively widen the overlapped exposure area for obtaining equal display characteristics.

Thus, in this embodiment, the overlapped exposing process is performed at a pitch of one pixel. In reality, the width of the overlapped exposure area is preferably 10 μm or less. In this embodiment, the width of the overlapped exposure area is 6 μm. Experimental results show that irregular luminance does not take place in the overlapped exposure area and thereby an image can be properly displayed. In other words, the overlap width of the overlapped exposure area should be predetermined corresponding to the characteristics of the liquid crystal display device so that the narrow portion of the pattern does not adversely affect the image quality.

The array substrate fabricated by the above-described fabrication method is disposed opposite to the opposite substrate 21 as shown in FIG. 2. The gap between the array substrate and the opposite substrate 21 is filled with a liquid crystal material. As a result, an active matrix type liquid crystal display device is obtained. As shown in FIG. 2, an opposite electrode 22 composed of a transparent electrode material is formed on the entire inner surface of the opposite substrate 21. In addition, when necessary, alignment films (not shown) are formed between the array substrate 20 and the liquid crystal and between the opposite substrate 21 and the liquid crystal. Moreover, a light insulation layer may be formed in an area opposite to the gap of the display pixel electrode of the opposite substrate 22. Furthermore, a color filter layer of R, G, and B may be formed in an area opposite to the display pixel electrode.

The display quality of the liquid crystal display device according to the present invention was evaluated in the following manner.

First, the luminance of each of a plurality of points on the display screen was measured so as to obtain the difference of luminances in shot areas.

In other words, the same image signal was input to the signal lines 51. With a luminance meter, the luminances at a plurality of positions of each shot area were measured. The mean values were compared with each other as representative values of the luminances in the shot areas.

Figure 8:
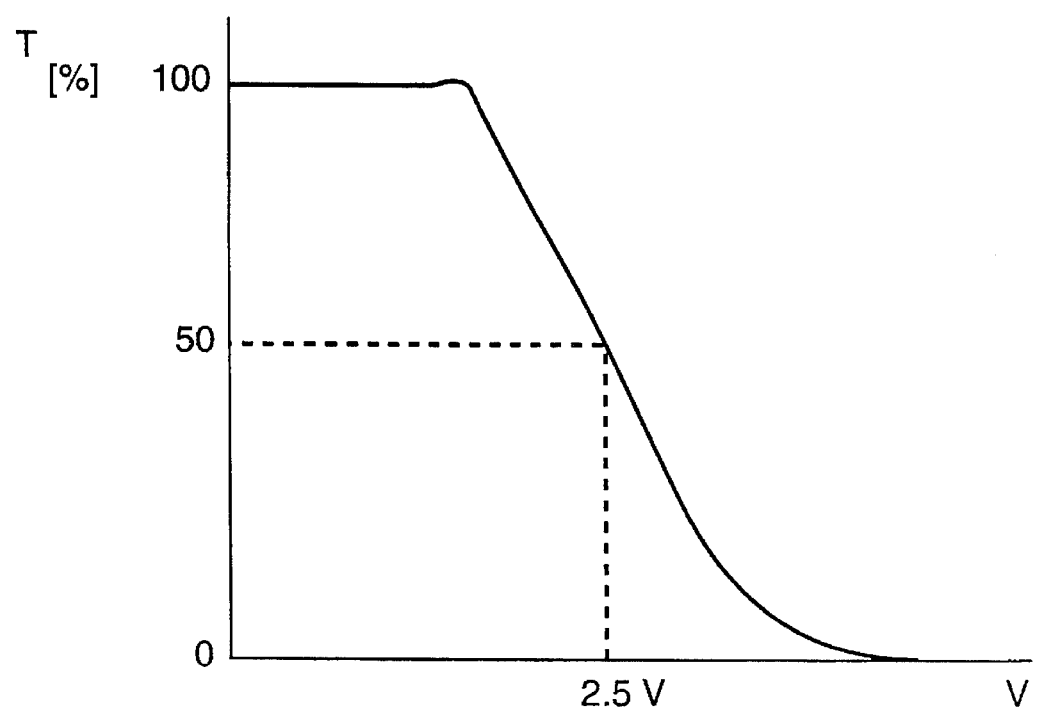
FIG. 8 is a graph showing a logical curve of applied voltages (signal line voltages) and transmittances of the active matrix type liquid crystal display device according to the embodiment.

FIG. 8 is a graph showing a logical curve of applied voltages (signal line voltages) and transmittances (namely, V-T curve) of the active matrix type liquid crystal display device according to this embodiment. In FIG. 8, a signal line voltage represents a voltage that is input to a signal line. A transmittance represents a relative value of a luminance assuming that the luminance at a signal line voltage of 0 V is 100%. In the evaluation method of this embodiment, a voltage of approximately 2.5 V was applied to a signal line 51 so that the transmittance of each pixel logically becomes 50%.

Measurement results show that the difference of transmittances in different shot areas is 0.6%.

Next, the active matrix type liquid crystal display device according to this embodiment was sensuously tested to determine whether or not to view a boundary line of shot areas. In reality, the display device according to this embodiment was disposed in a darkroom. A screen was displayed in the same drive condition as the above-described luminance measurement test and a total of 100 people conducted the sensuous test so as to determine whether or not to view the boundary line.

As the results, these test attendants could not view the boundary line. In addition, with different viewing angles, the same tests were conducted. As the results, these test attendants could not view the boundary line of shot areas.

Moreover, an active matrix type liquid crystal display device that was fabricated in the same manner as the above-described embodiment and that has different pitches of pixels was tested in the same manner. In this test, the difference of transmittances of adjacent shot areas was only 1.0%. However, the boundary line of shot areas was not viewed at all.

Thus, according to the display device of the present invention, since a boundary line of adjacent shot areas is not viewed at all, an image can be displayed with high quality. In addition, according to the fabrication method of the display device of the present invention, even if there is difference of luminances of pixels in adjacent shot areas (small areas) due to the deviation of mask alignment in the photofabrication process, the difference of luminances that is a boundary line can be ignored. As a result, the yield of fabrication can be remarkably improved.

The fabrication method of the present invention can be applied for the case that the number of shots is greater than that of the above-described embodiment. Thus, the area of the display device can be further increased.

It should be noted that the present invention is not limited to the above-described embodiment. Instead, various modifications are available. For example, as the patterning method, a method other than the so-called PEP method can be used. In addition, the structure of the TFT device is not limited to the above-described structure. For example, a channel protection film composed of an insulating material such as SiOx may be formed on a semiconductor layer in a channel area of a TFT. In this case, the fabrication method of the present invention can be applied for the patterning process of the channel protection film.

Moreover, the sequence of forming processes of each electrode layer and dielectric layer is not limited to that of the above-described embodiment. When necessary, the laminating order of layers may be changed. Alternatively, when the patterning process is performed, a plurality of layers may be exposed and etched at a time.

Furthermore, the matrix arrangement of pixels may be changed to any arrangement other than the row and column matrix.

In the above-described embodiment, the shot area dividing method of which pixels of one shot area and pixels of another shot area are regularly mixed on the boundary of these shot areas. However, it should be noted that the dividing method is not limited to such a method. Instead, various modifications are available.

When the width of mixed pixels of both shot areas (namely, the pitches in the column direction) is 0.5 cm or greater, more preferably 1 cm or greater, the rate of change of luminances remarkably decreases. Even if the difference of luminances of adjacent areas is 1% or greater, the boundary line could become unobtrusive.

Figure 9:
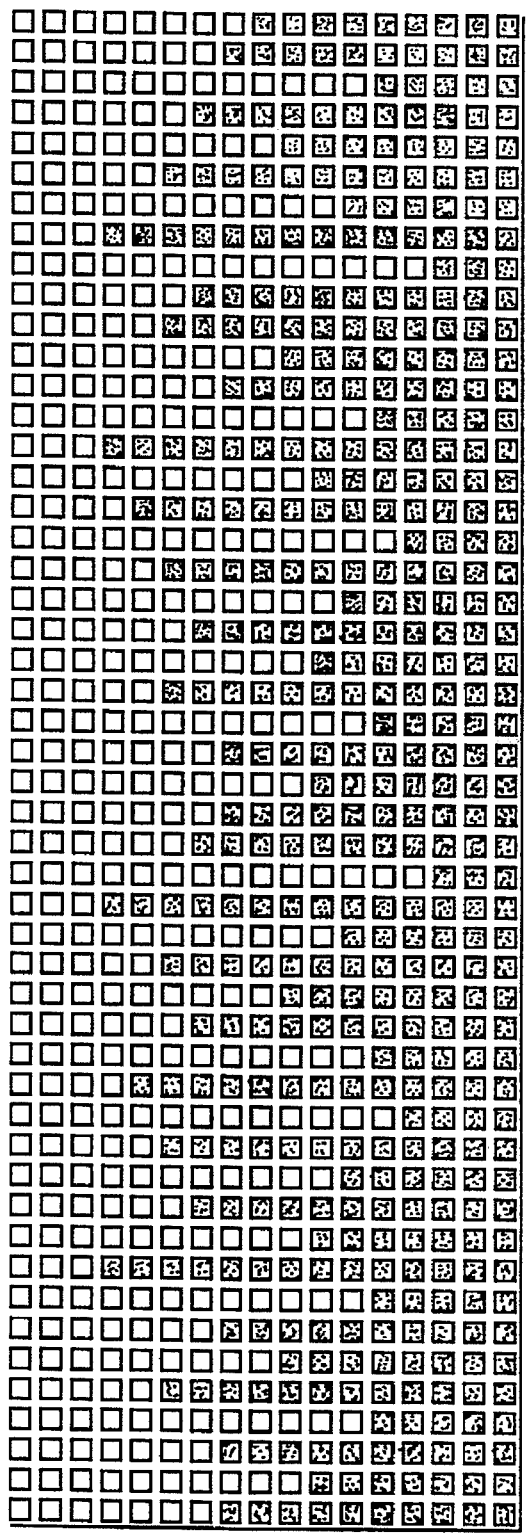
FIG. 9 is a plan view showing an arrangement of pixels constructing a boundary line at random pitches according to the present invention.

The pitches in the column direction are not always regular. For example, as shown in FIG. 9, the pitches of pixels that construct a boundary line may be arranged at random. In reality, the pitches of mixed pixels in adjacent areas are designated so that they vary at random (with random numbers) corresponding to the width of each pixel (namely, the pitch of each pixel in the column direction). The pitch of pixels in adjacent areas at each row position is designated by multiplying the pitch of each pixel by a random number. In this embodiment, the width of each pixel is 100 μm. In addition, random numbers vary in the range from 0 to 99. Thus, the maximum pitch is 0.9 cm. The pitches of individual columns vary in such a range at random.

Experimental results show that randomly designated pitches are especially effective for a color liquid crystal display apparatus of which a color filter is used for a liquid crystal display device.

In other words, depending on a designating method of a boundary line, a boundary line may pass through pixels of one particular color of three primary colors R, G, and B. In this case, the luminance of each pixel on the boundary line is almost the mean value of the luminances of particular color components between one shot area and another shot area. However, since the colors R, G, and B have different luminousities, the luminance of each pixel on the boundary line may remarkably deviate from the mean value of luminances of left and right shot areas of which R, G, and B components are composited. Thus, depending on the difference of luminances of adjacent shot areas, a portion with a large luminance difference may be viewed as a boundary line.

On the other hand, when the pitches of pixels in the column direction of the boundary line are randomly designated, the probability of which the boundary line passes through only particular color pixels can become almost zero. Thus, the luminance of pixels on the boundary line is almost the mean value of the luminances of left and right shot areas of which R, G, and B components are composited. Consequently, the luminance of one shot area does not have a large difference from that of another shot area. In such a manner, the probability of which a boundary line is viewed can be further effectively reduced.

Figure 10:
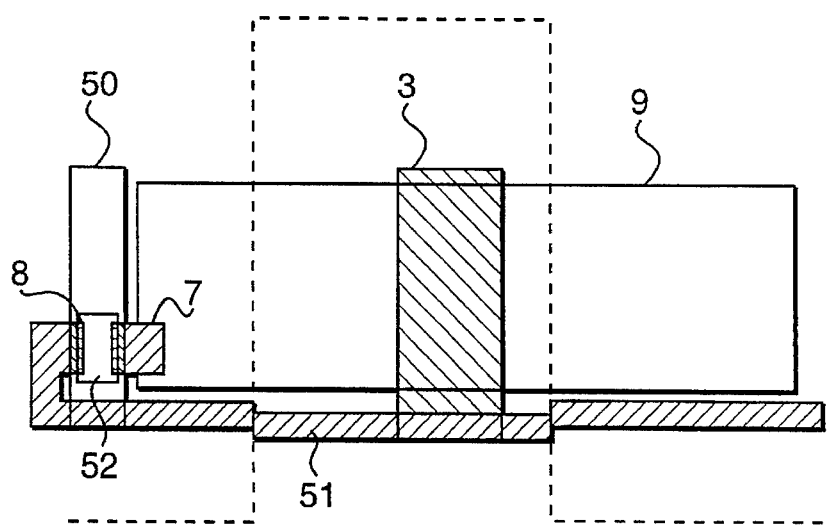
FIG. 10 is a plan view showing a boundary line that traverses a pixel a plurality of times.
Figure 11:
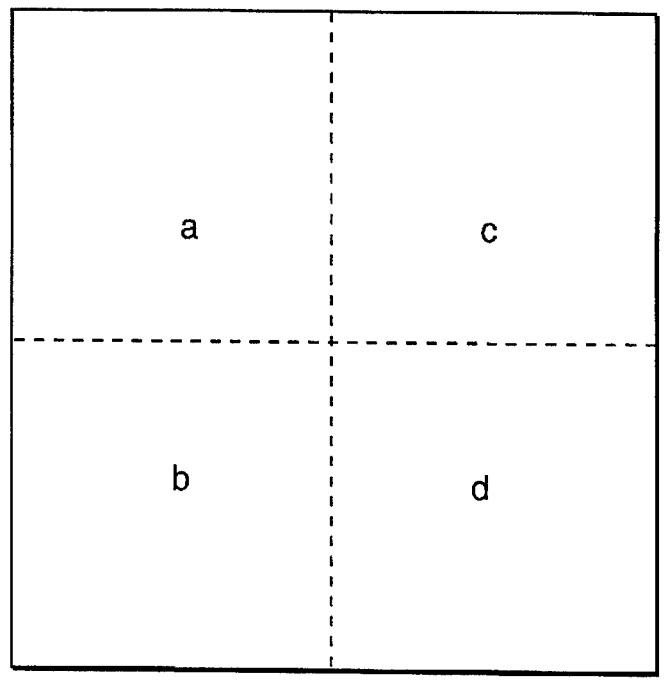
FIG. 11 is a plan view showing a patterning process for a divided exposing type display device fabricated using a conventional stepper.

In addition, as shown in FIG. 10, a boundary line may traverse one pixel several times. In the method shown in FIG. 10, the boundary line is designated so that one pixel is divided into three portions. Thus, the rate of change of luminances can be further reduced.

Now, assume the case that the distance between a display pixel electrode 9 and a signal line 51 in a portion of an upper exposure area a deviates from that in a portion of a lower exposure area b due to the dislocation of a photomask in the exposing process. Thus, the stray capacitance between the display pixel electrode 9 and the signal line 51 in the exposure area a is different from that in the exposure area b. The difference of stray capacitances causes the voltage applied to the liquid crystal in the area a to be different from that in the area b. In the method as shown in FIG. 10, since there are two distances between the display pixel electrode 9 and the signal line 51, the resultant stray capacitance becomes the mean value between the stray capacitance of the exposure area a and the stray capacitance of the exposure area b. Thus, the rate of change of voltages becomes the means value of these areas. Consequently, when such pixels are disposed between two areas, the rate of change of luminances can be reduced.

In this embodiment, the boundary line of shot areas on each layer (thin film) that is patterned passes through the same pixel area. In other words, if the boundary line passes through different pixels on the individual thin film layers, the stray capacitance varies on each thin film. Thus, it is very difficult to predict the change of luminances in the vicinity of the area of the boundary line due to the change of stray capacitances. On the other hand, when the boundary line of each layer passes through the same pixel area, since the luminances of left and right shot areas are averaged, the luminance distribution can be easily predicted (namely, designated). Thus, the effects of the present invention of which a boundary line becomes unobtrusive can be more easily and securely performed.

In addition, according to the present invention, the above-described methods can be used in combinations. For example, a part of a boundary line may have random pitches. Alternatively, by the repetition of a boundary line of a portion with random pitches, one boundary line may be formed. With a proper combination of a plurality of factors of methods, an optimal method can be selected.

Thus, according to the active matrix type liquid crystal display device of the above-described embodiment, since a boundary line of adjacent areas (adjacent small areas) that have been divided in an exposing process becomes unobtrusive, a screen with a high display quality can be accomplished. In addition, according to the fabrication method of the active matrix type liquid crystal display device of the above-described embodiment, even if there is a difference of luminances in exposure areas, a boundary line of these areas can become unobtrusive. Thus, the yield of the fabrication can be improved.

Industrial Utilization:

As described above, according to the present invention, a boundary line of adjacent areas with different transmittances can become unobtrusive. In addition, according to the fabrication method of the thin film fabricating process, the yield of each structural portions of the array substrate can be remarkably improved.

We claim:

1. A method for fabricating a display device, comprising the steps of:

making a stacked layer of a conductor layer and a dielectric layer on a plurality of small areas of an insulation substrate; and patterning the conductor layer or the dielectric layer of each small area so as to make pixels in a predetermined arrangement, wherein a boundary line of adjacent small areas is formed in a non-linear shape.

2. A method for fabricating a display device, comprising the steps of:

making a stacked layer of a first thin film and a second thin film on a plurality of small areas of an insulation substrate, the first and second thin films being composed of a conductor layer or a dielectric layer; and patterning the first and second layer of each small area so as to make pixels in a predetermined arrangement, wherein each of a boundary line of adjacent small areas on the first thin film and a boundary line of adjacent small areas on the second thin film are formed in a non-linear shape, the boundary line on the first thin film and the boundary line on the second thin film passing through the same pixel area.

3. The method as set forth in claim 1, wherein the display device is a liquid crystal display.

4. The method as set forth in claim 1, wherein said patterning step is performed by light radiating means.

5. A method for fabricating a display device, comprising the steps of:

making a stacked layer of a conductor layer and a dielectric layer on a plurality of small areas of an insulation substrate; and patterning the conductor layer or the dielectric layer of each small area so as to make pixels in a predetermined arrangement, wherein the boundary line of adjacent small areas traverses any pixel several times.

* * * * *